US006429030B1

United States Patent
Burmeister et al.

(10) Patent No.: US 6,429,030 B1
(45) Date of Patent: Aug. 6, 2002

(54) METHOD FOR TESTING A SEMICONDUCTOR DIE USING WELLS

(75) Inventors: Gernot U. Burmeister; Allan M. Fetty, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/246,633

(22) Filed: Feb. 8, 1999

(51) Int. Cl.⁷ .......................... H01L 21/66; G01R 31/26
(52) U.S. Cl. ............................ 438/14; 438/16; 438/17; 438/18; 321/754; 321/755; 321/758; 321/762; 321/765
(58) Field of Search ...................... 321/754, 755, 321/758, 762, 765; 29/825, 846, 848, 851, 856; 438/14, 15, 16, 17, 18

(56) References Cited

U.S. PATENT DOCUMENTS

| 4,950,623 A | 8/1990 | Dishon ................... 437/183 |
| 4,975,079 A | 12/1990 | Beaman et al. ............ 439/482 |
| 5,006,792 A | 4/1991 | Malhi et al. ............. 324/158 F |
| 5,065,227 A | 11/1991 | Frankeny et al. .......... 357/74 |
| 5,073,117 A | 12/1991 | Malhi et al. .............. 439/71 |
| 5,289,631 A | 3/1994 | Koopman et al. ........... 29/840 |
| 5,290,710 A | 3/1994 | Haj-Ali-Ahmadi et al. .... 437/8 |
| 5,399,505 A | 3/1995 | Dasse et al. ............... 437/8 |
| 5,605,844 A | 2/1997 | Oki et al. ................. 437/8 |
| 5,674,785 A | 10/1997 | Akram et al. ............ 437/217 |
| 5,716,218 A | 2/1998 | Farnworth et al. ........ 438/15 |
| 5,793,117 A | 8/1998 | Shimada et al. .......... 257/780 |
| 5,878,485 A | * 3/1999 | Wood et al. ............. 29/825 |
| 6,040,702 A | * 3/2000 | Hembree et al. .......... 324/755 |

FOREIGN PATENT DOCUMENTS

JP         55-111127         8/1980         ........... H01L/21/28

* cited by examiner

Primary Examiner—David Nelms
Assistant Examiner—Reneé R. Berry
(74) Attorney, Agent, or Firm—Robert A. Rodriguez

(57) ABSTRACT

Testing is performed on a semiconductor die (50) having a plurality of protruding electrical contacts (52) formed thereon. The test method uses a carrier (100) having a plurality of wells (110) formed in a dielectric layer (118) thereon. At least a portion of the protruding electrical contacts (52) is inserted into a corresponding portion of the plurality of wells (110) in order to make electrical connections between the semiconductor die (50) and the carrier (100) with minimal damage to the protruding electrical contacts (52). Testing (e.g. functional testing, burn-in testing, full-speed testing) of the semiconductor die (50) may then be performed using the electrical connections. Once testing of the semiconductor die (50) is completed, the semiconductor die (50) is removed from the carrier (100) and the carrier (100) may be reused for testing a different semiconductor die.

19 Claims, 4 Drawing Sheets

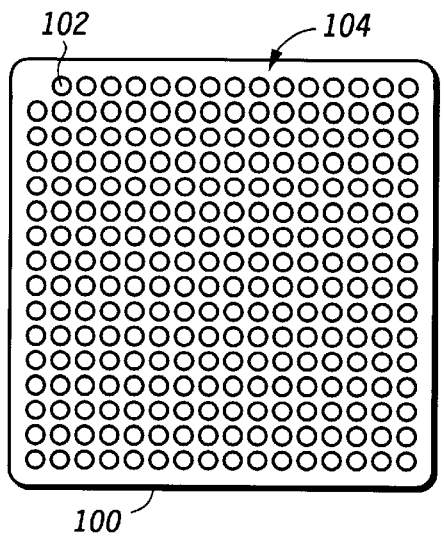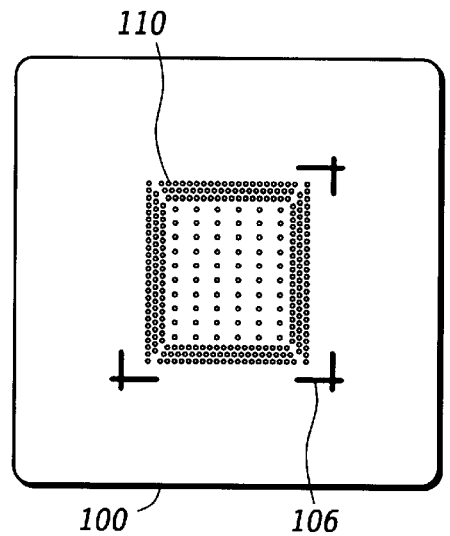
*FIG.2*  *FIG.3*
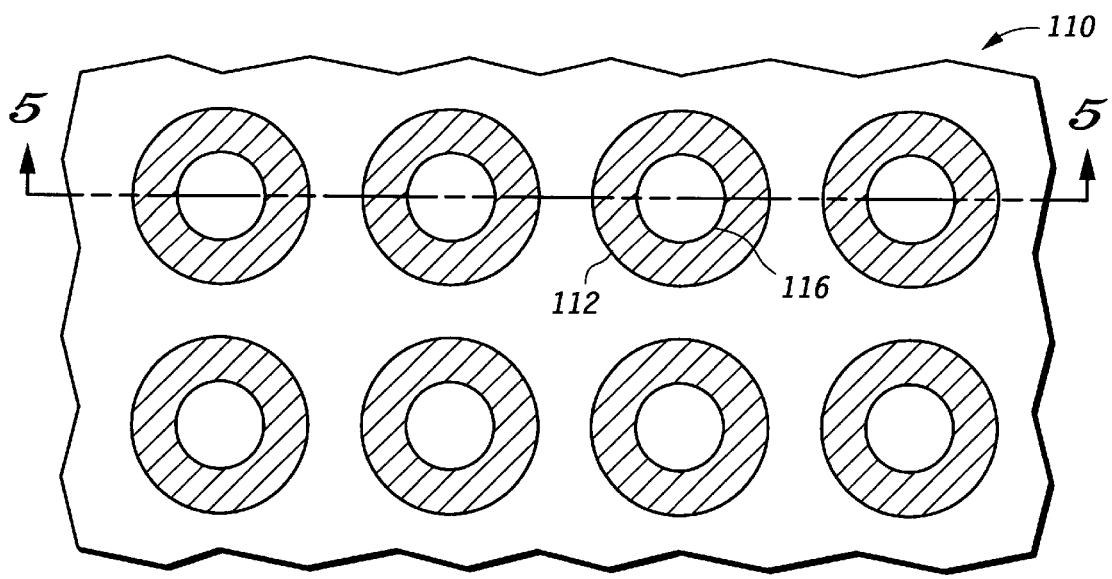
*FIG.4*
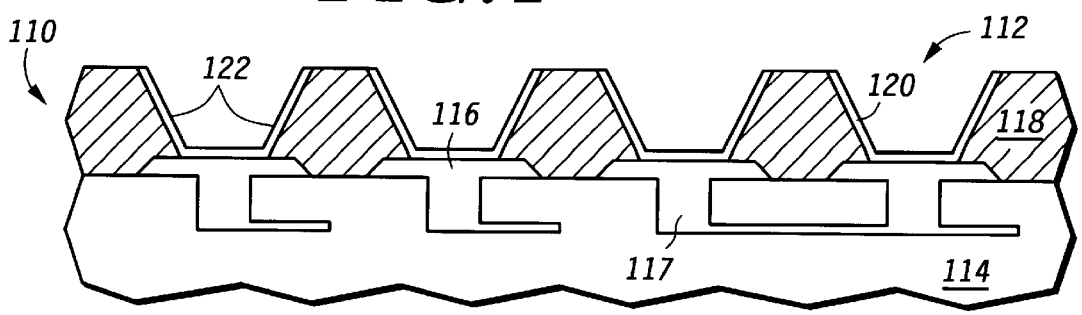
*FIG.5*

METHOD FOR TESTING A SEMICONDUCTOR DIE USING WELLS

This is based on U.S. patent application Ser. No. 08/987,714 filed Dec. 9, 1997, which is hereby incorporated herein by reference, and priority thereto for common subject matter is hereby claimed.

FIELD OF THE INVENTION

The present invention relates in general to semiconductor die, and more particularly to testing of semiconductor die using wells.

BACKGROUND OF THE INVENTION

Semiconductor manufacturers have the cost saving goal of detecting and screening out defective integrated circuits as early as possible in the manufacturing process. In addition, the requirement of supplying "known good die" to multi-chip module (MCM) manufacturers has increased the importance of this goal.

During a typical semiconductor manufacturing process, a plurality of integrated circuits are formed as individual die on a semiconductor wafer. At present, each semiconductor wafer generally has dozens to hundreds of individual die formed thereon. As integration geometries decrease and the size of semiconductor wafers increase, the number of integrated circuit die formed on each wafer will most likely increase.

While the die are still in wafer form, each die is probed in order to determine whether each die passes a very basic opens/shorts test (e.g. a test for electrical opens or electrical shorts). In some cases, a full functional test is also performed using the probe equipment. However, no reliability testing is performed because it would be too costly to tie up the probe equipment testing one or a few die at a time for the hours required for reliability testing.

The purpose of the wafer level probe test is to determine, as early as possible in the manufacturing process, whether each individual die is defective or not. The earlier a defective die is detected, the less money that is wasted on further processing of defective die.

The die are then separated or singulated into individual die using any one of a variety of singulation techniques. In most cases, each die is then packaged in an integrated circuit package. Once the die have been packaged, thorough electrical testing is performed on each of the packaged integrated circuits. The purpose of the thorough electrical testing is to determine whether each packaged integrated circuit properly performs the functionality specified by the semiconductor manufacturer. The tested, packaged integrated circuits are then sold.

In some cases, the packaged integrated circuits also undergo a reliability testing procedure called burn-in. Burn-in testing involves the testing of an integrated circuit for an extended period of time while the temperature of the integrated circuit is elevated above room temperature. In some cases, the heat generated by the integrated circuit itself is sufficient to elevate the temperature of the integrated circuit. In other cases, the temperature of the integrated circuit is raised by an apparatus external to the integrated circuit (e.g. a burn-in oven in which the packaged integrated circuits are placed).

Alternately, instead of or in addition to burn-in testing, cold temperature reliability testing may be performed. Cold temperature reliability testing involves the testing of an integrated circuit for an extended period of time while the temperature of the integrated circuit is decreased below room temperature.

Semiconductor manufacturers spend a significant amount of money packaging defective die which pass the testing performed during probing, but which do not pass the reliability testing after packaging. In addition, the probe testing is redundant in that the same electrical tests are again performed on the individual integrated circuits after packaging.

The cost saving goal of detecting and screening out defective die as early as possible in the manufacturing process is especially important in the context of multi-chip modules (MCMs). Multi-chip modules (MCMs) are electronic modules that include a plurality of integrated circuit die which are packaged together as one unit. Multi-chip modules are becoming more widely used.

For multi-chip modules, it is quite costly to replace one or more failed die once the die have been bonded onto a substrate. Therefore, it is desirable to determine whether or not a die is fully functional and is reliable before the die is packaged as part of a multi-chip module. In addition, many manufacturers of multi-chip modules are requiring that semiconductor manufacturers sell them fully tested "known good die" which have passed reliability tests and which are not packaged in an integrated circuit package.

As summarized above, testing of "known good die" has become particularly important in modem semiconductor manufacturing. In this regard, various testing procedures have been devised with respect to semiconductor die that have bond pads to which are connected wire bonds, known in the art as a wirebond die. One example of a portion of an apparatus to test and burn-in such wirebond die is shown in FIG. 1.

FIG. 1 illustrates a prior art structure including carrier 10 which is connected to socket 12, which in turn is connected to testing equipment (not shown) for testing and burn-in of die 50. As shown, carrier 10 includes a forced delivery mechanism 14 which is connected to lid 16 through a biasing member (e.g. a spring). The force delivery mechanism is placed to overlie die 50 and bias die 50 in a downward direction such that the wirebond pads around the outer periphery of the die are biased against carrier contacts 18. As shown, the carrier contacts 18 have a "mushroom" shape, and are connected to interconnects 20 which extend over compliant material. The interconnects 20 are in turn connected to electrical contacts (not shown) extending through the socket 12.

While the apparatus shown in FIG. 1 including carrier 10 and socket 12 may be used to test and burn-in wirebond-type die, it is not particularly adapted for testing and burn-in of "bumped" semiconductor die, such as die having bumps formed on an active surface thereof by the known Control Collapsed Chip Connection technology ("C4"). As is known in the art, such bumped die have a relatively large array of solder bumps provided on the active surface of the semiconductor die. The bumped die is configured to be inverted and placed on a plastic or ceramic substrate, and the solder bumps are reflowed to effect mechanical and electrical connection between the bumped die and the substrate. However, the bumps formed on the die are at a relatively fine pitch, and are formed in a relatively large number. For example, a common C4 bump is on the order of 125 microns in diameter and adjacent bumps are spaced apart from each other by 125 micron spaces.

Accordingly, the array is formed at a relatively fine pitch, typically on the order of 250 microns. In current applications, a typical microprocessor semiconductor die can have on the order of one thousand or greater C4 bumps.

Because of the relatively large number, high density and fine feature size associated with bumped die, numerous difficulties exist with testing and burn-in. More particularly, in an attempt to test or burn-in a bumped die, the present inventors attempted to modify the known carrier 10 depicted in FIG. 1 for use with a C4 bumped die, which brought to light several problems. First, as shown in FIG. 1, the carrier contact 18 has somewhat of a "mushroom" shape, wherein the upper contact surface of the carrier contact 18 is roughened to have a texture which contacts the C4 bumps. This texture is effective to break a native oxide on wirebond pads, to make ohmic contact to the wirebond pads. However, this same texture has the effect of roughening and pitting the C4 bumps on the die. As a result of the pitting, it was found that the vision equipment utilized for alignment during the first level packaging operation (i.e., bonding of the bumped die to the substrate) could not properly image and align the bumped die with the substrate. In addition, it was believed that roughening of the contact surfaces of the bumps may cause problems subsequent to reflow, including void formation and perhaps reliability problems.

Further, it was found that according to the bumped die in which the bumps are laid out in an array fashion at a relatively small pitch (i.e. high density), the carrier contacts 18 had to be placed at an equally fine pitch, separated by even smaller spacing than the C4 bumps, due to the flared "mushroom" top of the carrier contacts 18. In this regard, it was found that the side of the die which is formed subsequent to the sawing operation is not generally formed with the precision required for the die to properly align with the carrier contacts. Accordingly, slight shifts in formation of the side surfaces of the die cause shifting of the die, whereby the bumps straddle adjacent carrier contacts which cause undesirable shorting. This phenomena is due to the fact that the sides of the die are used for alignment purposes within the carrier 10.

In an attempt to address the deficiencies of the known carrier, the present inventors considered using more sharply pointed carrier contacts. However, it was determined that such carrier contacts would not be practically feasible for a number of reasons. For example, such contacts would cause problems with the vision equipment for alignment, voids in the bumps, etc.

Other methods for testing bumped die include a technique wherein a temporary solder joint is formed, between the C4 bump and a test substrate, and testing equipment connected to the I/O pins or BGA (ball grid array) balls of the substrate. According to this technique, the bumped die is placed on a substrate having relatively small contact pads, and reflow is carried out. However, this technique requires physical separation of the bumped die from the substrate, after reflow and testing, which is laborious and not cost effective.

Accordingly, it is quite clear that a need exists in the art for testing bumped semiconductor die utilizing a novel known good die carrier particularly adapted for bumped die.

BRIEF DESCRIPTION OF THE DRAWINGS

FIGS. 2 and 3 are bottom and top plan views, respectively, of a known good die carrier according to one embodiment of the present invention;

FIG. 4 is an exploded view of the well array provided along the top surface of the known good die carrier shown in FIG. 3;

FIG. 5 is a cross-sectional view of FIG. 4 along sectional line 5—5';

DETAILED DESCRIPTION

Figure 1:
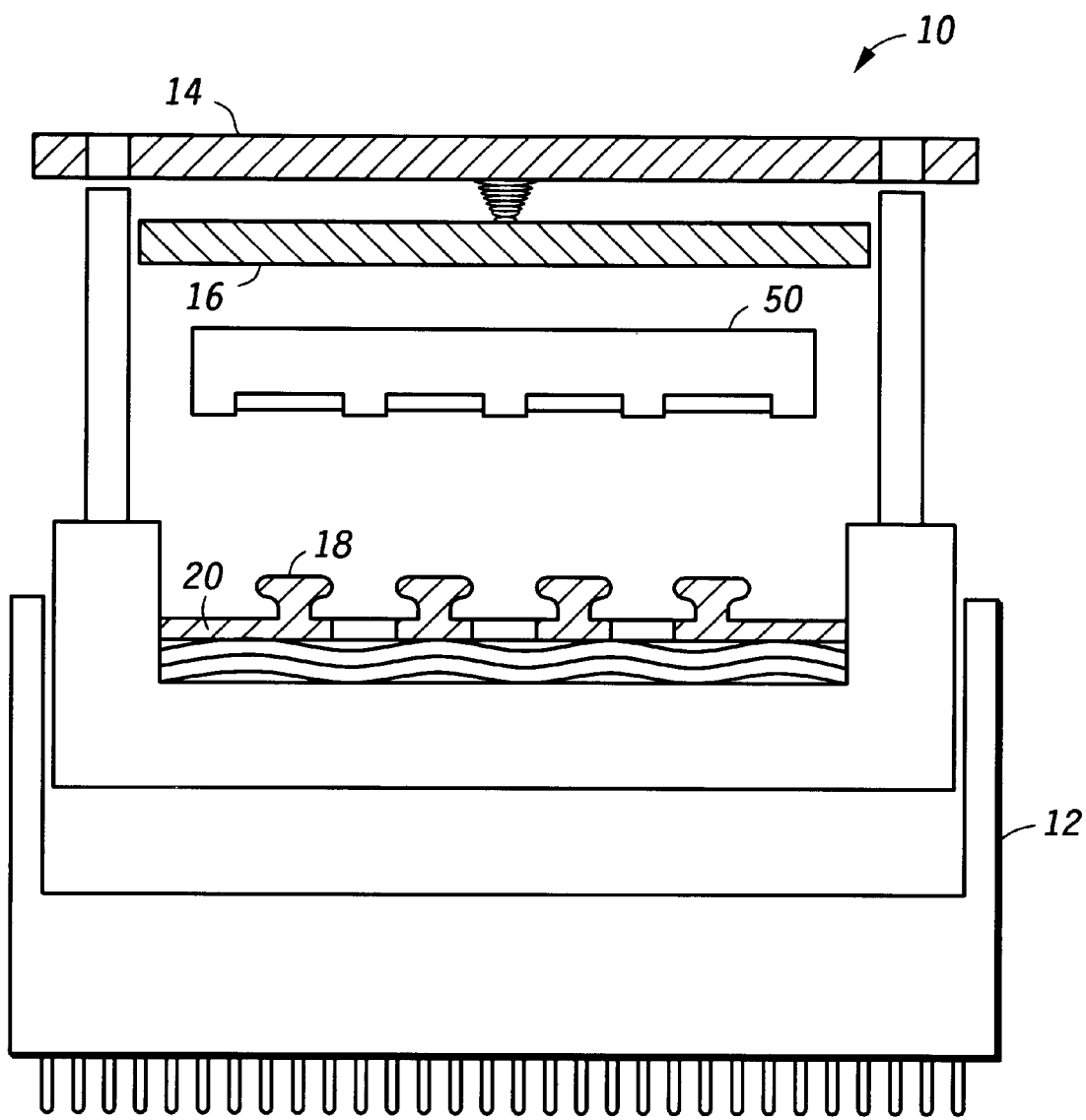
FIG. 1 is a schematic view of a prior art known good die carrier and socket used for wirebond-type semiconductor die.

Turning to FIGS. 2 and 3, an embodiment according to the present invention is disclosed, depicting a known good die (KGD) carrier 100, having a bottom surface on which a ball grid array (BGA) 104 is formed, having individual BGA balls 102. On the top surface of the KGD carrier 100, a well array 110 and a plurality of alignment fiducials 106 are formed. Although not depicted in FIGS. 2 and 3, it is understood that the electrical contacts from individual wells 112 are electrically routed to individual BGA balls 102 for a subsequent connection to appropriate known testing equipment (not shown). That is, KGD carrier 100 fans out the well array 110 to a larger scale array, BGA 104. It is also noted that the embodiment shown in FIGS. 2 and 3 illustrates a KGD carrier for use with a singulated bumped semiconductor die. However, the KGD carrier 100 may be formed so as to accommodate a plurality of die, such as a 10×10 or 20×20 array of die. Alternatively, the KGD carrier may be configured to test all die formed on a wafer.

The details of the well array 110 are more clearly shown in FIGS. 4 and 5. As illustrated, well array 110 includes individual wells 112 that terminate at a bottom surface thereof in the form of contact pads 116. More particularly, the KGD carrier 100 includes a substrate 114 on which are formed a plurality of the contact pads 116, each of which is connected to an interconnect 117. Preferably the substrate is made of a ceramic insulating material, but may also be formed of an organic polymer (i.e. plastic) as is well known in the art. In this embodiment, the contact pad 116 is formed of a thin film of Ti/Cu, with a Cu/Ni plating layer. The wells 112 are defined within a dielectric layer 118 that is formed on the substrate 114. According to the embodiment shown, the dielectric layer is formed of polyimide, but may be formed of other dielectric materials as well.

Wells 112 include a conductive layer 120 which covers the side surface of the wells, and which defines peripheral side surfaces 122. In this particular embodiment, the peripheral side surfaces 122 are inclined, at an angle preferably on the order of 105–115 degrees, such as 110 degrees, with respect to the plane of the contact pads 116. As described in more detail below, the inclined nature of the peripheral side surfaces 122 is particularly important to induce a scrubbing action between the bumps on the semiconductor die and the conductive layer 120. In addition the inclined nature of the peripheral side surfaces 122 increases interfacial area between the bump and the well to improve electrical contact, and also provides a self-aligning feature for the bumped semiconductor die. These features are more clearly illustrated with respect to FIGS. 6 and 7 discussed below.

As shown, the well array 110 of the KGD carrier 100 has a perimeter portion and an interior portion. As is clear to one of ordinary skill, the bumps on the die have a configuration that corresponds to that of the well array 110. As used herein, the perimeter portion includes about half of the total surface area of the die, and the interior portion includes the balance (i.e., the other half). Note that in alternate embodiments of the present invention, the well array 110 may range from a totally random pattern to a completely symmetrical and regular pattern, with any range of non-regularity in between.

Figure 6:
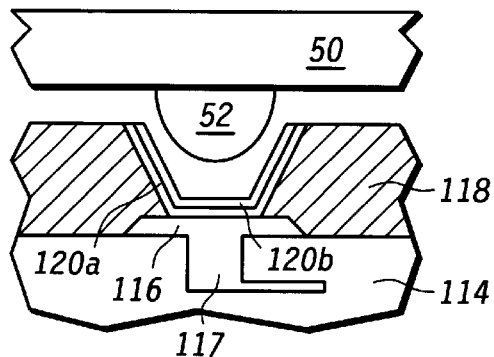
FIG. 6 is an exploded cross-sectional view of a single well of the well array as shown in FIG. 5, prior to receiving a bumped semiconductor die.
Figure 7:
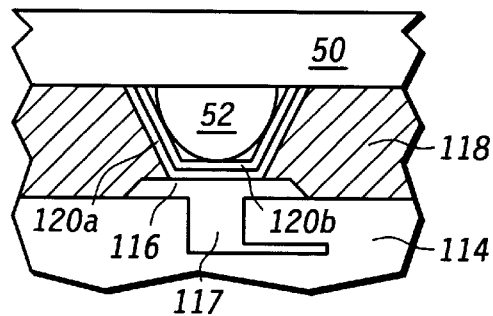
FIG. 7 illustrates a view similar to FIG. 6, after receiving the bumped semiconductor die.

For clarity, FIGS. 6 and 7 illustrate a single well/bump interface according to a particular embodiment of the present invention. As disclosed, semiconductor die 50 includes a bump 52, which is mated to a well 112 of the well array 110 of the KGD carrier 100. In this particular embodiment, the bump is formed by the known C4 process, and is comprised of a high lead solder, particularly, 97/3 (97% Pb/3% Sn) solder which has relatively high melting point. However, the bump, more generally, the protruding electrical contact, may be formed by techniques other than C4. The bump may be formed by screen printing and reflow, using a vacuum stencil to apply solder balls, or any other technique. In addition, other conductive materials such as sputtered gold may be used. The arcuate or rounded shape of the bump 52 is provided by reflow of the lead and tin materials after deposition on bump sites on the semiconductor die 50.

As shown in more detail in FIGS. 6 and 7, the conductive layer 120 includes an adhesion film 120a and a plating film 120b which together define the peripheral side surface 122 of the well 112. The adhesion film 120a is formed of a thin film of Cr/Ti/Cu, and has a Ni plating thereon. The plating film 120b is formed of a relatively hard metal, approximately 5 microns of Pd/Ni. It is noted that the adhesion film 120a is incorporated to promote adhesion between the plating film 120b and the polyimide material of the dielectric layer 118. The particular composition of the conductive film 120 can be altered based upon the ultimate needs of the user. For example, should a dielectric layer formed of a material other than polyimide be employed, alternative conductive materials may be utilized.

As shown in FIG. 7, when the semiconductor die 50 is dropped completely down and onto the KGD carrier 100, the dielectric layer 118 provides a stand-off, between the bottom (active) surface of the semiconductor die 50 and the bottom surface of the bump 52. By provision of the dielectric layer 118 at a particular thickness, the bump 52 is prevented from being crushed or "pancaked". Note that the depth of well 112 may be a function of the height of bump 52. Preferably, the depth of well 112 is on the order of the height of the bump 52, and more preferably, slightly less than the height of the bump 52. Accordingly, the bump 52 may be slightly deformed due to the pressure exerted on the semiconductor die 50, at least in the vertical Y direction.

According to the particular embodiment shown, the peripheral side surface 122 of the well 112 contacts and scrubs against the corresponding peripheral side surface of the bump 52. This scrubbing action is ensured by configuring the precise diameter of the well for the particular size of the bump 52. That is, the well 52 has a diameter which is slightly larger at the top and smaller at the bottom than a corresponding diameter or profile of the bump, so that the bump is "squeezed" or compressed in the horizontal X direction during downward movement of the bump into the well 112. Accordingly, by appropriately choosing the thickness of the dielectric layer 118 relative to the height of the bump, and the diameter of the well 112 relative to a corresponding diameter of the bump 52, electrical contact is ensured through scrubbing action along the peripheral side surfaces of the well 112 and the bump 52, as well as the contact pad 116 and an opposing bottom surface of the bump 52.

Figure 8:
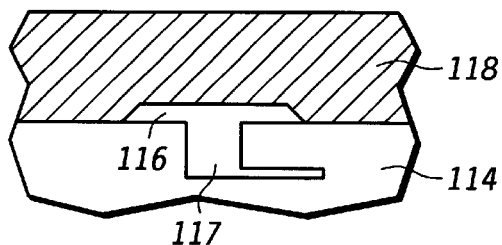
FIGS. 8–12 illustrate various steps in forming an embodiment of the known good die carrier according to one embodiment of the present invention.
Figure 9:
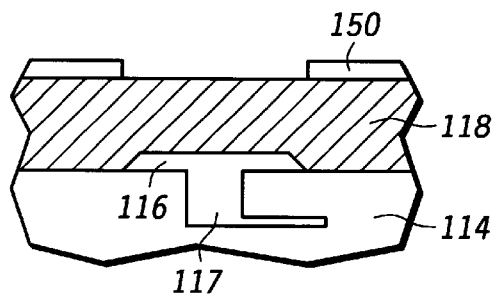
Figure 10:
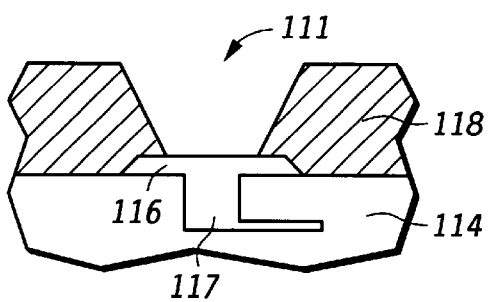
Figure 11:
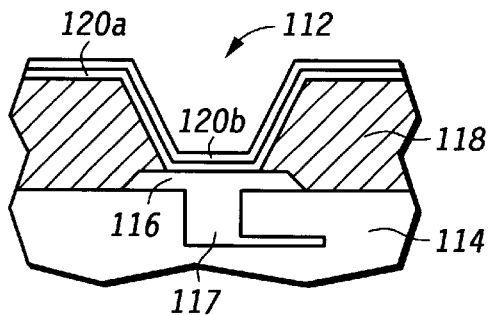
Figure 12:
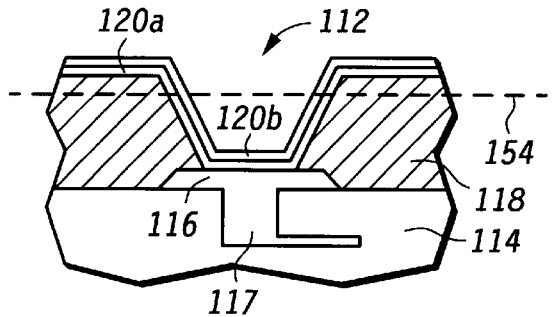

FIGS. 8–12 depict various process steps according to one method for forming the KGD carrier 100 according to the present invention. FIG. 8 illustrates providing a dielectric layer 118 on substrate 114. As noted above, the dielectric layer 118 is formed of polyimide and is spun-on according to conventional techniques. Thereafter, as shown in FIG. 9, a mask layer 150 is formed and patterned so as to provide an opening overlying the contact pad 116. The mask 150 is formed by depositing copper on the dielectric layer 118. The copper is etched according to conventional techniques to form the opening. Then, as shown in FIG. 10, the dielectric layer 118 is etched by utilizing the known technique of reactive ion etching (RIE). As is known in the art, this etching technique combines physical and chemical etching processes. Thus, by relying upon a physical component (ions) and a chemical component the wells 112 may be formed. In one embodiment, RF (radio frequency) power, reduced pressure (i.e. less than atmospheric), and gas flow rate are used to determine the slope of the peripheral side surfaces 122 of wells 112.

After formation of the well opening 111 (FIG. 10), adhesion film 120a and plating film 120b of the conductive layer 120 are deposited by sputtering. As shown, layers 120a and 120b are conformal, that is, extend along the entire exposed area of the KGD carrier 100. Following deposition of the conductive layer 120, the structure is ground along grind plane 154 to form a planar surface, and to remove all portions of the conductive layer 120 that do not extend into respective wells 112. Accordingly, the wells 112 are electrically isolated from each other, and the conductive film 120 of each well extends to and is in electrical contact with a respective contact pad 116.

Figure 13:
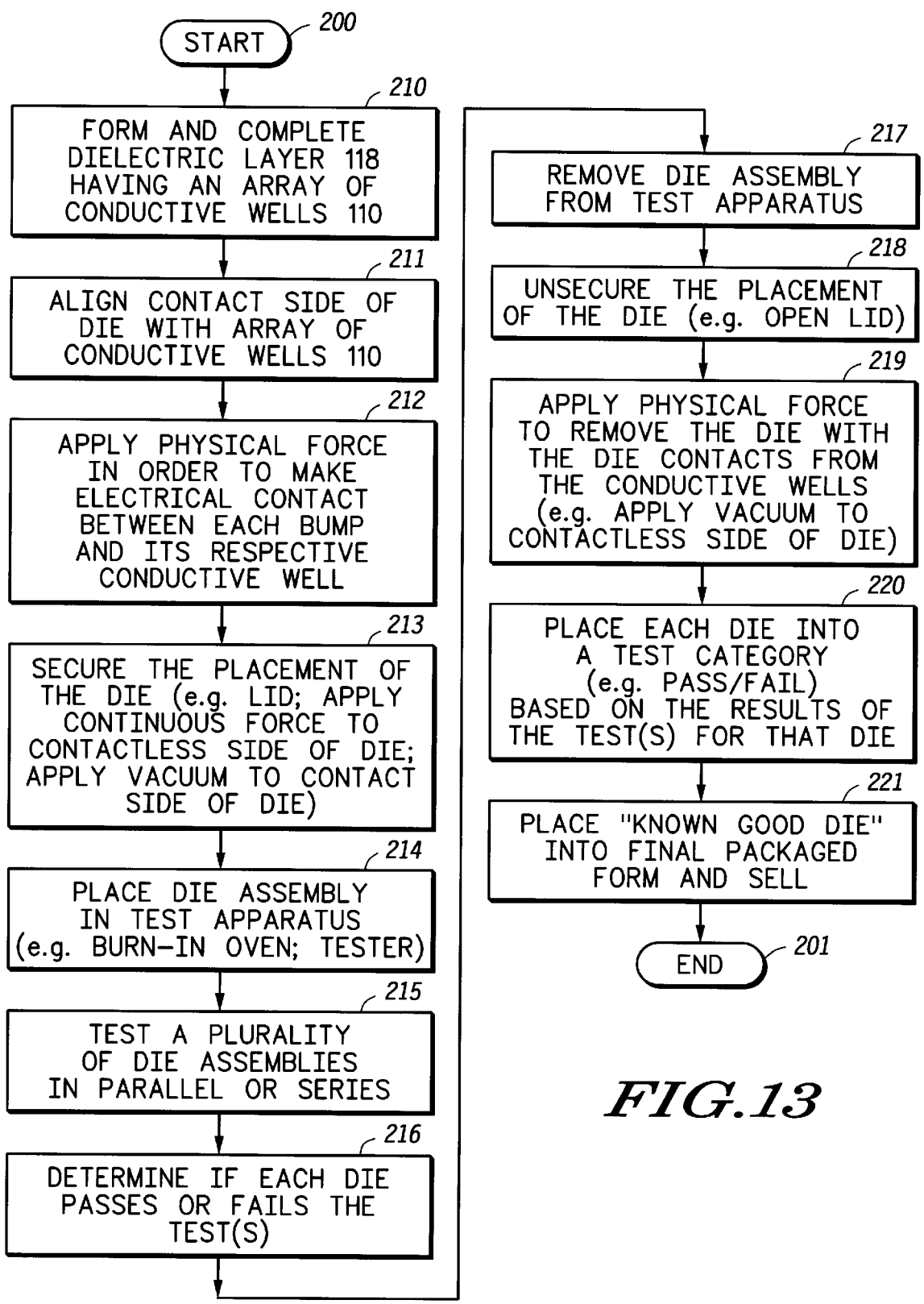
FIG. 13 is a flow diagram representing a method of carrying out a known good die test according to an embodiment of the present invention.

Turning to FIG. 13, a process flow diagram is illustrated for testing a bumped semiconductor die according to one embodiment of the present invention. As shown, oval 200 indicates the start of the process, and oval 201 indicates the end of the process. A process flow is initiated with step 210 wherein a dielectric layer 118 is formed and completed, having an array of conductive wells 110. Step 211 is continued from step 210, wherein the contact side of the die, (i.e., the bumped surface of the die) is aligned with the array of conductive wells 110. Step 212 continues from step 211, wherein physical force is applied to the die in order to achieve electrical contact between the bumps of the semiconductor die and respective conductive wells 112. Step 213 is continued from step 212, wherein the semiconductor die is secured within the KGD carrier 100 (e.g. via a lid attached to the KGD carrier 100, by using continuous force applied to the contactless side of the semiconductor die 50 to ensure electrical contact, or by using vacuum applied to the contact side of the semiconductor die 50 to ensure electrical contact).

Step 214 continues from step 213, wherein the die assembly including KGD carrier 100 and semiconductor die 50, is placed in a test apparatus. Step 215 continues from step 214, wherein a plurality of die assemblies are tested in parallel or in series. Step 216 continues from step 215, wherein each die is evaluated to determine whether the die passes or fails a test or tests executed by the test apparatus. Step 217 continues from step 216, wherein the die assemblies are removed from the test apparatus. Step 218 continues from step 217, wherein the die is unsecured from the KGD carrier 100, such as by opening a lid. Step 219 continues from step 218, wherein physical force is applied to remove the die from the KGD carrier 100 (e.g. by applying vacuum to the inactive surface opposite the bumped, active surface of the die 50). Note that further processing such as bump restoration or bump reflow is not necessary because the bumps have not been deformed beyond viable use. Thereafter, step 220 continues from step 219, wherein each die is placed in a test category (pass/fail), based on the results of the test or tests for that die. Step 221 continues from step 220, wherein "known good die" is placed into final packaged form and sold. Then, as stated above, the process flow ends with oval 209.

It is to be understood, therefore, that this invention is not limited to the particular forms illustrated and that the appended claims cover all modifications that do not depart from the spirit and scope of this invention.

What is claimed is:

1. A method for testing a semiconductor die, comprising:
   providing a carrier having openings extending through a dielectric layer, wherein each of the openings exposes an underlying surface, and wherein each of the openings has a first dimension and a second dimension, each of the first dimension and the second dimension being substantially parallel to a surface of the dielectric layer, wherein the second dimension is closer to the underlying surface than the first dimension, and wherein the second dimension is smaller than the first dimension;
   providing a first semiconductor die having protruding electrical contacts, wherein each of the protruding electrical contacts corresponds to one of the openings;
   inserting the protruding electrical contacts into the openings to establish electrical connections between the protruding electrical contacts and the openings; and
   electrically testing the first semiconductor die using the electrical connections.

2. A method as in claim 1, wherein each one of the protruding electrical contacts is a bump.

3. A method as in claim 2, wherein each bump comprises solder.

4. A method as in claim 1, wherein the protruding electrical contacts and the openings are arranged in an array.

5. A method as in claim 4, wherein the array is non-regular.

6. A method as in claim 1, wherein the underlying surface is a contact pad.

7. A method as in claim 6, further comprising a conductive layer overlying the contact pad.

8. A method as in claim 7, wherein the conductive layer further includes portions formed along sidewalls of the openings.

9. A method as in claim 7, wherein the portions formed along the sidewalls of the openings are inclined with respect to the contact pad.

10. A method as in claim 8, wherein the portions formed along the sidewalls of the openings are inclined at an angle in a range of 105 degrees to 115 degrees.

11. A method as in claim 1, wherein a height of the protruding electrical contacts is equal to or greater than a depth of the openings.

12. A method as in claim 1, wherein a width dimension of the protruding electrical contacts at its widest location is less than the first dimension and greater than the second dimension.

13. A method as in claim 1, wherein the carrier is comprised of a material from a group consisting of ceramic and organic polymer.

14. A method as in claim 1, wherein the dielectric layer is comprised of polyimide.

15. A method as in claim 11, wherein said step of inserting further comprises:
   performing a scrubbing action to improve electrical conductivity of the electrical connections.

16. A method as in claim 1, further comprising:
   providing a second semiconductor die; and
   electrically testing the second semiconductor die using said carrier.

17. A method for testing a semiconductor die, comprising:
   providing a carrier having openings extending through a dielectric layer wherein each of the openings exposes an underlying surface, and each of the openings has a taper, the taper narrowing toward the underlying layer;
   providing a first semiconductor die having protruding electrical contacts, wherein each of the protruding electrical contacts corresponds to one of the openings;
   aligning the semiconductor die and the carrier;
   inserting the protruding electrical contacts into the openings;
   applying physical force to establish electrical connections between the protruding electrical contacts and the openings;
   electrically testing the semiconductor die using the electrical connections;
   determining if the first semiconductor die failed electrically testing;
   separating the first semiconductor die and the carrier; and
   reusing the carrier to test a second semiconductor die.

18. A method as in claim 17, wherein the carrier is comprised of a material from a group consisting of ceramic and organic polymer.

19. A method as in claim 17, wherein the dielectric layer is comprised of polyimide.

* * * * *

UNITED STATES PATENT AND TRADEMARK OFFICE
CERTIFICATE OF CORRECTION

PATENT NO.      : 6,429,030 B1
DATED           : August 6, 2002
INVENTOR(S)     : Gernot U. Burmeister et al.

It is certified that error appears in the above-identified patent and that said Letters Patent is hereby corrected as shown below:

Column 7,
Line 48, change "claim 7" to -- claim 8 --.

Column 8,
Line 1, change "claim 8" to -- claim 9 --.

Signed and Sealed this

Twenty-third Day of September, 2003

JAMES E. ROGAN
*Director of the United States Patent and Trademark Office*